US010540099B2

(12) United States Patent
Harrand et al.

(10) Patent No.: US 10,540,099 B2
(45) Date of Patent: Jan. 21, 2020

(54) SYSTEM FOR MANAGING THE WEAR OF AN ELECTRONIC MEMORY

(71) Applicant: Commissariat à l'Énergie Atomique et aux Énergies Alternatives, Paris (FR)

(72) Inventors: Michel Harrand, Saint Egreve (FR); Elisa Vianello, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 15/103,265

(22) PCT Filed: Dec. 12, 2014

(86) PCT No.: PCT/EP2014/077652
§ 371 (c)(1),
(2) Date: Jun. 9, 2016

(87) PCT Pub. No.: WO2015/086846
PCT Pub. Date: Jun. 18, 2015

(65) Prior Publication Data
US 2016/0313930 A1    Oct. 27, 2016

(30) Foreign Application Priority Data
Dec. 12, 2013  (FR) .................... 13 62470

(51) Int. Cl.
*G06F 3/06* (2006.01)
*G06F 12/14* (2006.01)

(52) U.S. Cl.
CPC .......... *G06F 3/0616* (2013.01); *G06F 3/0623* (2013.01); *G06F 3/0629* (2013.01);
(Continued)

(58) Field of Classification Search
CPC .............. G11C 7/1075; G11C 13/0002; G11C 13/0035; G11C 13/0061; G11C 16/3495;
(Continued)

(56) References Cited

U.S. PATENT DOCUMENTS 7,913,032 B1 * 3/2011 Cornwell ............ G06F 12/0246
                                                            711/103
2004/0022085 A1    2/2004 Parkinson et al.
(Continued)

FOREIGN PATENT DOCUMENTS

WO    WO 2011/119647 A1    9/2011

OTHER PUBLICATIONS

Written Opinion, dated Oct. 16, 2015, from corresponding International Application No. PCT/EP2014/077652.
(Continued)

*Primary Examiner* — David Yi
*Assistant Examiner* — Zubair Ahmed
(74) *Attorney, Agent, or Firm* — Wolf, Greenfield & Sacks, P.C.

(57) ABSTRACT

A system including: a first memory including several portions each of several pages, this memory including first and second ports that enable simultaneous access to two pages of distinct portions of the memory; and a control circuit suitable for implementing, via the second port, a method for balancing the wear of the memory, including movements of data within the memory, while authorizing simultaneous user access to the memory contents via the first port.

18 Claims, 5 Drawing Sheets

(52) U.S. Cl.
CPC ........ *G06F 3/0679* (2013.01); *G06F 12/1408* (2013.01); *G06F 2212/402* (2013.01)

(58) Field of Classification Search
CPC .... G06F 3/0616; G06F 3/0623; G06F 3/0629; G06F 3/0679; G06F 12/1408; G06F 2212/7211
See application file for complete search history.

(56) References Cited

U.S. PATENT DOCUMENTS

| | | | |
|---|---|---|---|
| 2004/0057315 A1 | 3/2004 | Jain | |
| 2004/0128433 A1 | 7/2004 | Bains | |
| 2006/0227590 A1 | 10/2006 | Parkinson | |
| 2009/0100290 A1* | 4/2009 | Nakanishi | G11C 11/5628 714/5.1 |
| 2010/0058018 A1 | 3/2010 | Kund et al. | |
| 2010/0103723 A1 | 4/2010 | Kawai et al. | |
| 2010/0274952 A1* | 10/2010 | Lee | G06F 12/0292 711/103 |
| 2010/0281202 A1* | 11/2010 | Abali | G06F 12/0246 711/103 |
| 2011/0085398 A1 | 4/2011 | Roy | |
| 2011/0188335 A1* | 8/2011 | Roy | G11C 7/1075 365/230.03 |
| 2012/0271991 A1* | 10/2012 | Allen | G06F 12/0246 711/103 |
| 2013/0086305 A1* | 4/2013 | Ishikawa | G06F 13/16 711/103 |
| 2013/0201748 A1 | 8/2013 | Chung | |
| 2013/0235649 A1* | 9/2013 | Lindstadt | G11C 13/0035 365/148 |
| 2014/0137128 A1* | 5/2014 | Chang | G06F 9/4881 718/103 |
| 2014/0185360 A1 | 7/2014 | Kawai et al. | |
| 2014/0189284 A1* | 7/2014 | Hyuseinova | G06F 12/0238 711/206 |
| 2015/0019878 A1* | 1/2015 | Gammel | G06F 12/10 713/190 |

OTHER PUBLICATIONS

International Search Report, dated Oct. 8, 2015, from corresponding International Application No. PCT/EP2014/077652.

* cited by examiner

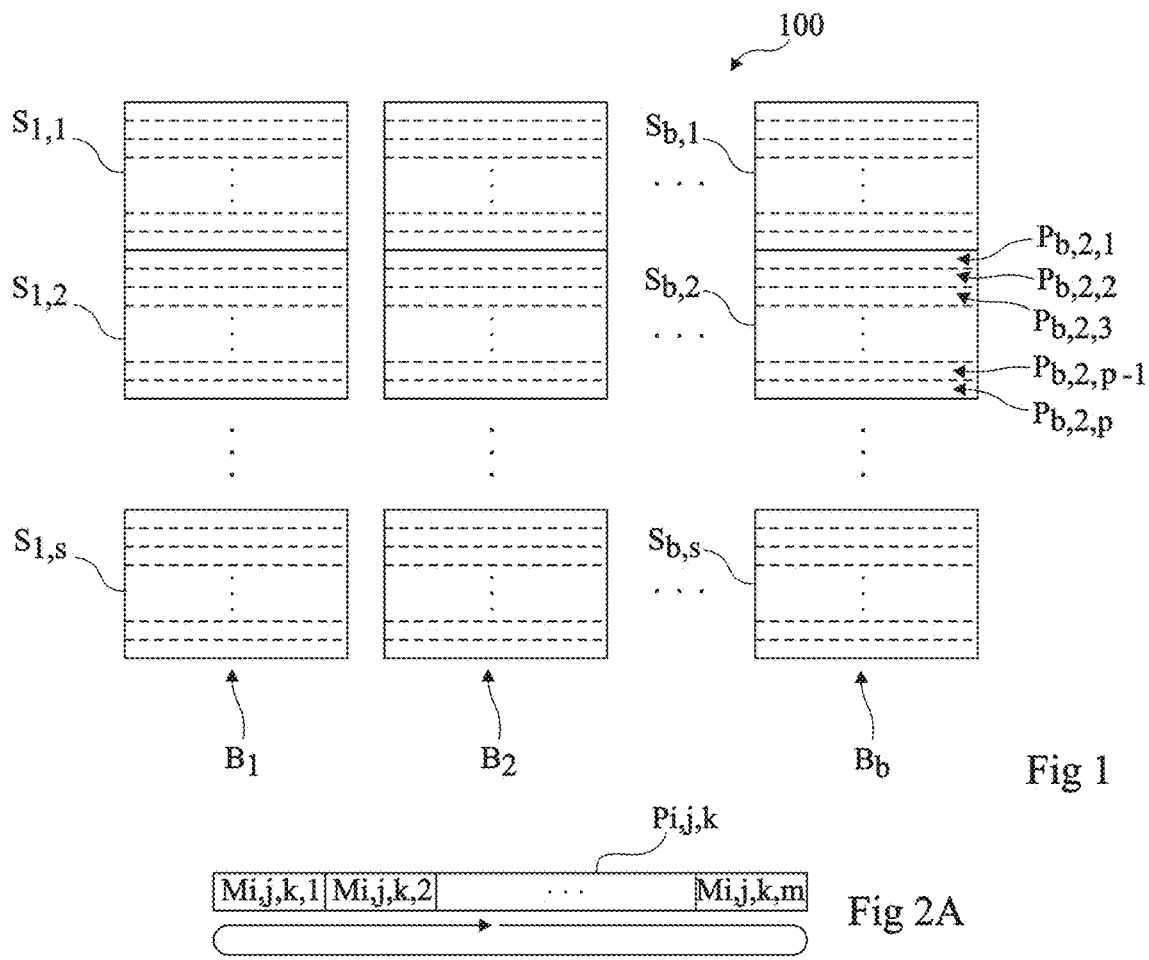
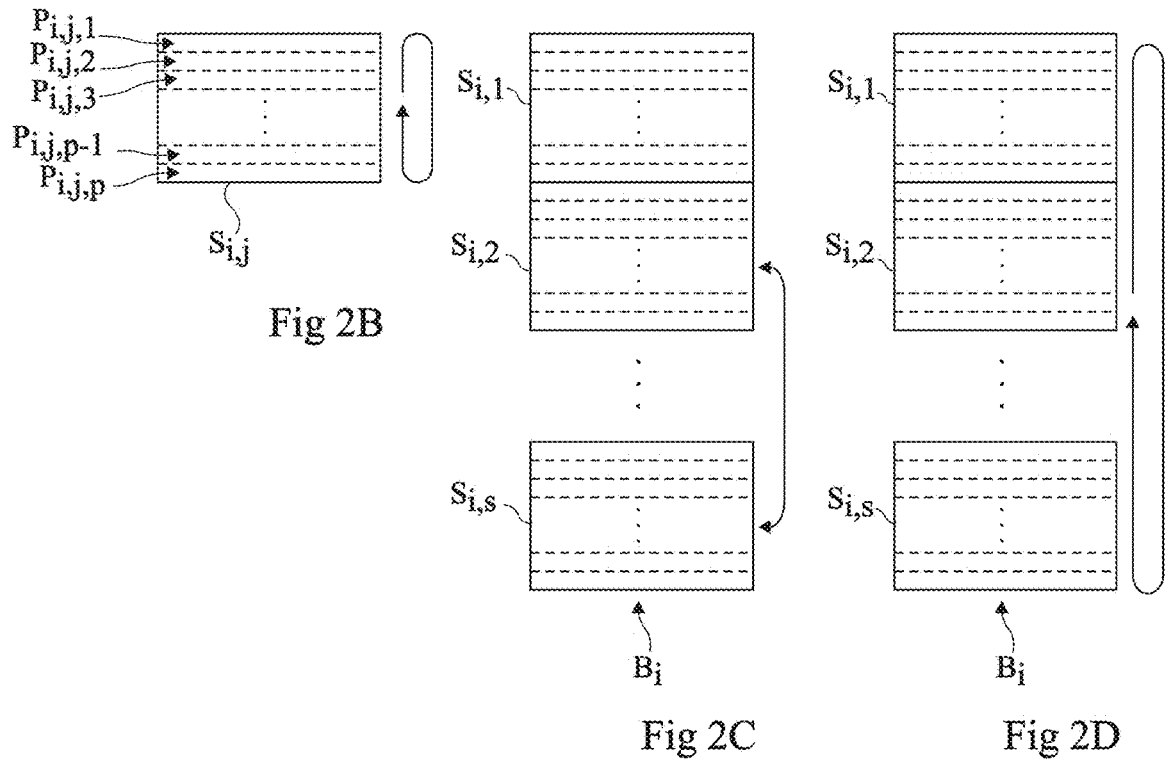
Fig 1
Fig 2A
Fig 2B
Fig 2C
Fig 2D

SYSTEM FOR MANAGING THE WEAR OF AN ELECTRONIC MEMORY

CROSS-REFERENCE TO RELATED APPLICATIONS

This application is the national phase of International Application No. PCT/EP2014/077652, filed on Dec. 12, 2014, which claims priority to French patent application 13/62470, filed on Dec. 12, 2013, both of which applications are hereby incorporated by reference to the maximum extent allowable by law.

BACKGROUND

The present application generally relates to the field of electronic memories, and more specifically aims at the managing of the wear in a memory.

DISCUSSION OF THE RELATED ART

In the present application, terms memory, memory device, or electronic memory are used to designate a device comprising a plurality of elementary storage cells, where each cell can be programmed to store one or a plurality of data bits (one bit if the storage element of the cell can take two different states, and a plurality of bits if the storage element of the cell can take more than two different states). In practice, a memory may contain a very large number of elementary cells, typically from several millions to several hundred billions. So-called resistive memories, that is, memories where each elementary storage cell comprises an element having a resistance which can be modified by being applied a bias voltage, are here more specifically considered. Among the most common resistive memories, one may especially mention:

phase change memories, generally called PCM in the art, where the resistive element is formed by means of a material having a crystalline state, and accordingly a resistivity, capable of being changed, by varying its temperature during a write operation;

conductive bridge random access memories, generally designated with acronym CBRAM in the art, where the resistive element is formed by means of an insulating material where a conductive filament may be created or suppressed by application of a bias voltage; and oxide-based resistive random access memories, generally designated with acronym OxRRAM in the art, where the resistive element is also formed by means of an insulating material where a conductive filament may be created or suppressed by application of a bias voltage.

Resistive memories are non-volatile memories, that is, they may keep the data that they contain even in the absence of an electric power supply. They further have good performances in terms of speed and of electric power consumption, for example, performances of the same order of magnitude, or even greater than those of volatile capacitive memories called DRAM ("Dynamic Random Access Memory"), which are widely used in many electronic systems. Further, resistive memories have a relatively low bulk, and particularly a lower bulk than DRAMs (for an identical data storage capacity).

In many electronic systems, it would be advantageous to be able to replace DRAM-type memories with resistive memories, to take advantage, in particular, of the non-volatility and of the high density of resistive memories.

However, a problem which is posed is that the elementary cells of resistive memories have a relatively low lifetime or endurance as compared with DRAMs. As an illustrative example, the maximum number of cycles, that is, the maximum number of read or write operations, that an elementary cell of a resistive memory can typically withstand is in the order of $10^8$, while this number is almost infinite for a DRAM.

Thus, to be able to use resistive memories in applications implementing frequent memory accesses, for example, as a RAM in a computer, a tablet, a smartphone, etc., mechanisms for controlling the wear of the memory, enabling to increase the lifetime, should be provided.

SUMMARY

Thus, an embodiment provides a system comprising: a first memory comprising a plurality of portions of a plurality of pages each, the memory comprising first and second portions enabling to simultaneously access two pages of the memory, provided for the pages to belong to different memory portions, each of said portions comprising a single port of access to the pages in the portion, where the port can be connected to one or the other of first and second memory ports by multiplexing circuits; and a control circuit capable of implementing, via the second port, a method of managing the wear of the memory, by simultaneously allowing user accesses to the content of the memory via the first port, the control circuit being capable of performing an access to a portion of the memory for the wear management method only when no user access is performed on this portion of the memory.

According to an embodiment, the wear management method is a wear balancing method comprising data displacements resulting in modifying the physical address of the data within the memory.

According to an embodiment, the control circuit is capable of processing in priority user accesses to the content of the memory over accesses of the wear management method.

According to an embodiment, the system comprises a counter or a table enabling the control circuit to know which addresses in the memory are being processed by the wear management method.

According to an embodiment, the control circuit is capable of only performing an access to a portion of the memory for the wear management method when no user access is being performed on this memory portion.

According to an embodiment, the control circuit is capable of only performing an access to a portion of the memory for the wear management method when a user access is being performed on another memory portion.

According to an embodiment, the control circuit is capable of only performing an access in write mode to a portion of the memory for the wear management method when a user access in write mode is being performed on another memory portion.

According to an embodiment, the control circuit is capable of only performing an access in read mode to a portion of the memory for the wear management method when a user access in read mode is being performed on another memory portion.

According to an embodiment, the system further comprises first and second registers, each capable of storing the content of a memory page.

According to an embodiment, the system further comprises first and second tables capable of each storing as many 2-bit entries as a memory portion comprises pages.

According to an embodiment, when data are displaced in the memory by the control circuit in the context of the wear management method, the data transit through the first and/or second registers and, when a user access targeting data contained in the first and/or second registers occurs, the control circuit processes this access in the registers.

According to an embodiment, the system further comprises second and third buffer memories each capable of storing the content of portion of the first memory.

According to an embodiment, the system further comprises first and second tables capable of each storing as many 1-bit entries as a portion of the first memory comprises pages.

According to an embodiment, when data are displaced in the first memory by the control circuit in the context of the wear management method, the data transit through the second and/or third buffer memories and, when a user access targeting data contained in the second and/or third memories occurs, the control circuit processes this access in the second and third memories.

According to an embodiment, the system further comprises a device capable of converting logic addresses, which are the addresses used by the user to access the content of the first memory, into physical addresses, which are the addresses where the contents targeted by the user in the first memory are effectively stored.

According to an embodiment, the address conversion device comprises, for each portion of the first memory, a counter or register for tracking shifts of pages within the portion.

According to an embodiment, the system comprises a device for scrambling, by means of an encryption key, the addresses used by the user to access the content of the first memory.

According to an embodiment, the data displacements of the wear management method are displacements internal to the memory portions, or displacements between different memory portions.

According to an embodiment, the wear management method comprises a wear measurement method comprising: a first step of reading from a page, the wear of which is desired to be measured; a second step of reading from said page with a threshold of discrimination between binary values '0' and '1' modified with respect to the first step; and a step of bit-to-bit comparison of the values read during the first and second reading steps.

According to an embodiment, the first memory is a resistive memory.

According to an embodiment, the wear management method comprises a wear repair method comprising alternately writing and deleting a plurality of times, into and from a memory cell deemed defective, and/or resetting this cell by applying thereto a voltage of same biasing as a voltage normally used to program this cell to the lightly-resistive state, but of higher value.

BRIEF DESCRIPTION OF THE DRAWINGS

The foregoing and other features and advantages will be discussed in detail in the following non-limiting description of specific embodiments in connection with the accompanying drawings, among which:

FIG. 1 schematically shows an example of organization or of layout of elementary data storage cells in a memory;

FIGS. 2A to 2F schematically illustrate examples of mechanisms or methods of managing the wear of a memory;

DETAILED DESCRIPTION

Figure 2E:
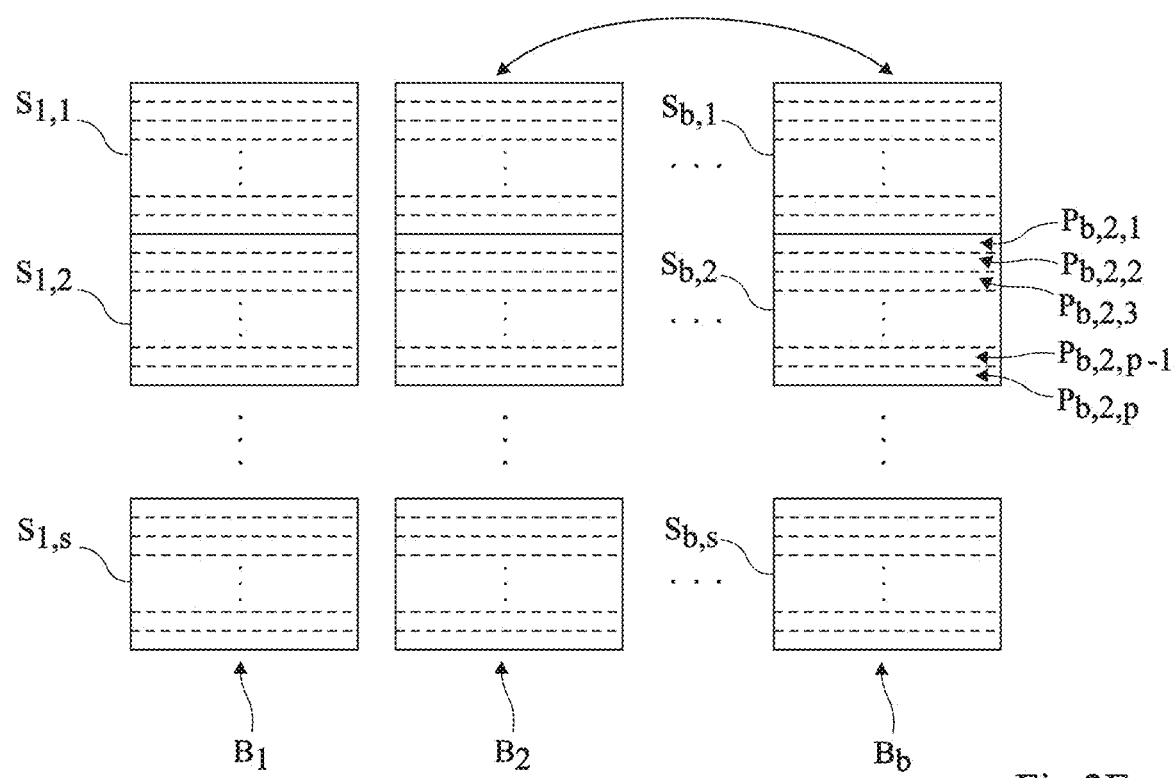

For clarity, the same elements have been designated with the same reference numerals in the different drawings. Further, only those elements which are useful to the understanding of the described embodiments have been shown and will be detailed hereafter. In particular, embodiments of systems comprising a memory and means for implementing methods of managing the wear of such a memory have been shown and will be detailed. However, the various uses which may be made of the memory of such systems have not been detailed, the described embodiments being compatible with current uses of such a memory.

FIG. 1 schematically shows an example of layout of elementary data storage cells (not shown in the drawing) in a memory 100, for example, a resistive memory. In this example, the elementary cells 100 are distributed into a plurality of banks Bi, i being an integer from 1 to b and b being an integer greater than 1, the cells of each bank Bi are distributed into a plurality of segments $S_{i,j}$, j being an integer in the range from 1 to s and s being an integer greater than 1, the cells of each segment $S_{i,j}$ are distributed into a plurality of lines or pages $P_{i,j,k}$, k being an integer in the range from 1 to p and p being an integer greater than 1, and the cells of each page $P_{i,j,k}$ are distributed into a plurality of words $M_{i,j,k,l}$, l being an integer in the range from 1 to m and m being an integer greater than 1, of a plurality of elementary cells each. Each page $P_{i,j,k}$ for example corresponds to the largest quantity of memory addressable in a single memory cycle, that is, the largest group of elementary cells which may be read from or written into in a single cycle in the memory. As a non-limiting illustration, memory 100 is a 32-gigabit memory, organized in 32 banks, each comprising 512 segments, each segment comprising 4,096 pages each comprising 16 words of 32 elementary cells (32 bits).

In practice, in most electronic systems using a memory, the distribution of the read and/or write accesses within the memory is very uneven. Indeed, certain data stored in the memory are used much more frequently than others. The memory portions containing the most frequently used data wear faster than the others, and their lifetime generally conditions the lifetime of the entire memory.

To increase the lifetime of a memory, it may be provided, when a memory portion has been written into more than a given number of times, to displace the data contained in this memory portion either within the actual portion, or to another memory portion. Such data displacements enable to better distribute the accesses to the physical memory cell, and thus to balance the wear of the memory and thus to increase the lifetime thereof. For such data displacements to be transparent for the memory user, a device of conversion of so-called logic addresses or user addresses, which are the addresses used by the user to access the memory, into so-called physical addresses, which are the addresses where the data having the user addresses pointing thereon are affectively physically stored, may be provided.

FIG. 2A schematically illustrates a first example of a wear management or balancing method which may be implemented in memory 100 of FIG. 1.

In this example, the accesses to each page $P_{i,j,k}$ of the memory are counted and, when the number of accesses to a page $P_{i,j,k}$ of the memory exceeds a threshold, an internal circular rotation of the data of this page is implemented, that is, the contents of words $M_{i,j,k,l}$ of the page are submitted to a circular rotation within the page. As an example, the content of the first word $M_{i,j,k,1}$ in the page is transferred into the second word $M_{i,j,k,2}$ in the page, the content of the second word $M_{i,j,k,2}$ in the page is transferred into the third word $M_{i,j,k,3}$ in the page, and so on until the last word $M_{i,j,k,m}$ in the page having its content transferred into the first word $M_{i,j,k,1}$ in the page.

FIG. 2B schematically illustrates a second example of a wear management or balancing method which may be implemented in memory 100 of FIG. 1.

In this example, after a number of accesses to a segment $S_{i,j}$ in the memory, an internal circular rotation of the data of this segment is implemented, that is, the contents of pages $P_{i,j,k}$ of the segment are submitted to a circular rotation within the segment. As an example, the content of the first page $P_{i,j,1}$ in the segment is transferred into the second page $P_{i,j,2}$ in the segment, the content of the second page $P_{i,j,2}$ in the segment is transferred into the third page $P_{i,j,3}$ in the segment, and so on until the last page $P_{i,j,p}$ in the segment, which has its content transferred into the first page $P_{i,j,1}$ in the segment.

As an example, the accesses to each segment $S_{i,j}$ in the memory may be counted and, when the number of accesses to a segment $S_{i,j}$ in the memory exceeds a threshold, an internal circular rotation may be applied to this segment. As a variation, if the method of FIG. 2A is implemented, an internal circular rotation may be applied to a segment $S_{i,j}$ when a same page of this segment has been submitted to a number of internal circular rotations, for example, equal to the number of words in the page, that is, when the content of each word $M_{i,j,k,l}$ in the page has returned to the physical location that it used to occupy before the first internal circular rotation of the page.

FIG. 2C schematically illustrates a third example of a wear management or balancing method which may be implemented in memory 100 of FIG. 1.

In this example, after a number of accesses to a memory segment $S_{i,j}$, the content of this segment is swapped with the content of another segment of the same memory bank $B_i$, for example, a segment having been submitted to a smaller number of accesses, for example, the segment of bank $B_i$ having been submitted to the smallest number of accesses.

As an example, the accesses to each segment $S_{i,j}$ in the memory may be counted and, when the number of accesses to a segment $S_{i,j}$ in the memory exceeds a threshold, a swapping of the content of this segment with the content of another segment of the same bank may be performed. As a variation, if the method of FIG. 2B is implemented, a swapping of the content of a segment $S_{i,j}$ with the content of another segment of the same bank may be performed when segment $S_{i,j}$ has been submitted to a number of internal circular rotations, for example, equal to the number of pages in the segment.

FIG. 2D schematically illustrates a fourth example of a wear management or balancing method which may be implemented in memory 100 of FIG. 1.

In this example, after a number of accesses to a bank $B_i$ of the memory, an internal circular rotation of the data of this bank is implemented, that is, the segments $S_{i,j}$ of the bank are submitted to a circular rotation within the bank. As an example, the content of the first segment $S_{i,1}$ in the bank is transferred into the second segment $S_{i,2}$ in the bank, the content of the second segment $S_{i,2}$ in the bank is transferred into the third segment $S_{i,3}$ in the bank, and so on until the last segment $S_{i,s}$ in the bank having its content transferred into the first segment $S_{i,1}$ in the bank.

As an example, the accesses to each bank $B_i$ in the memory may be counted and, when the number of accesses to a bank $B_i$ in the memory exceeds a threshold, this bank may be submitted to an internal circular rotation. As a variation, if the method of FIG. 2B is implemented within the memory segments, a bank $B_i$ may be submitted to an internal circular rotation when a same segment $S_{i,j}$ of this bank has been submitted to a number of internal circular rotations, for example, equal to the number of pages in this segment.

FIG. 2E schematically illustrates a fifth example of a wear management or balancing method which may be implemented in memory 100 of FIG. 1.

In this example, after a number of accesses to a memory bank $B_i$, the content of this bank is swapped with the content of another bank in the memory, for example, a bank having been submitted to a smaller number of accesses, for example, the memory bank having been submitted to the smallest number of accesses.

As an example, the accesses to each memory bank may be counted and, when the number of accesses to a bank $B_i$ in the memory exceeds a threshold, a swapping of the content of this bank with the content of another memory bank may be performed. As a variation, if the method of FIG. 2C or the method of FIG. 2D is implemented, a swapping of the content of a bank $B_i$ with the content of another bank may be performed when bank $B_i$ has been submitted to a number of internal swappings of segments (FIG. 2C) or of internal circular rotations (FIG. 2D), for example, equal to the number of segments in the bank.

Figure 2F:
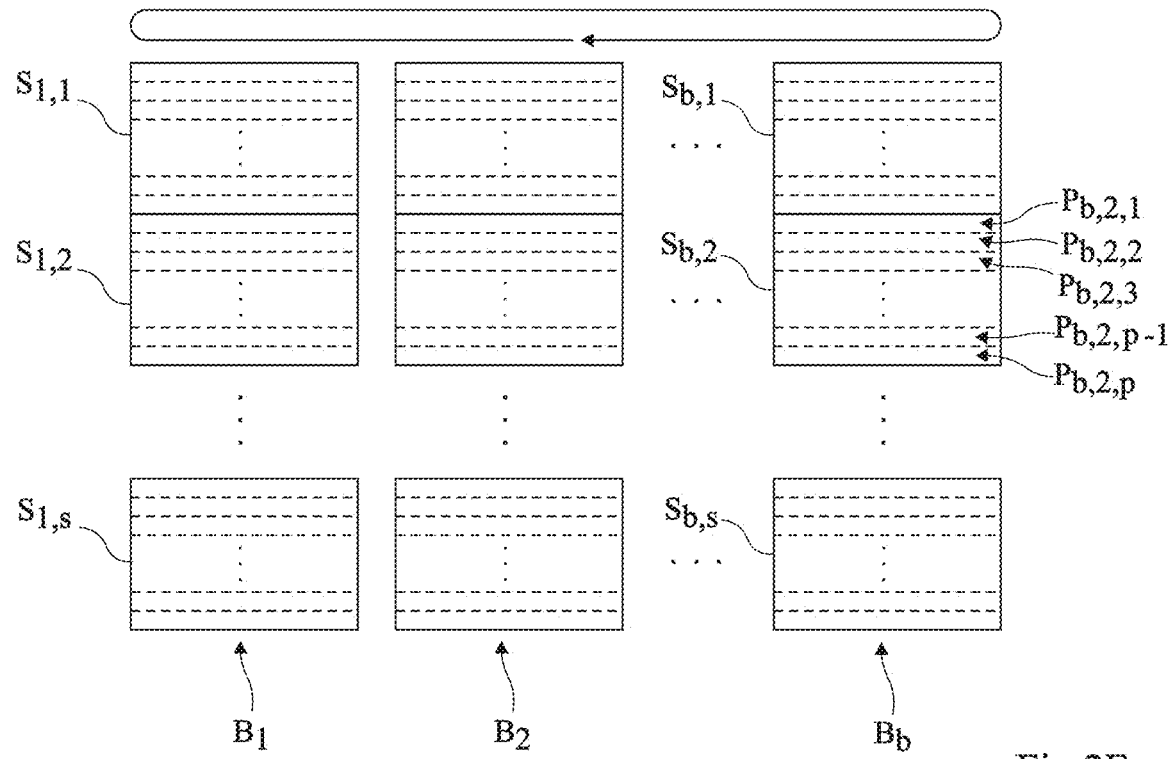

FIG. 2F schematically illustrates a sixth example of a wear management or balancing method which may be implemented in memory 100 of FIG. 1.

In this example, after a number of accesses to the memory, an internal circular rotation of the memory data is implemented, that is, banks $B_i$ are submitted to a circular rotation within the memory. As an example, the content of the first bank B1 is transferred into the second bank B2, the content of the second bank B2 is transferred into the third bank B3, and so on until the last bank Bb, which has its content transferred into first bank B1.

As an example, the accesses to the memory may be counted and, when the number of accesses to the memory exceeds a threshold, the memory may be submitted to an internal circular rotation. As a variation, if the method of FIG. 2C or the method of FIG. 2D is implemented, an internal circular rotation of the memory may be performed when a same bank $B_i$ in the memory has been submitted to a number of internal swappings of segments (FIG. 2C) or of internal circular rotations (FIG. 2D), for example, equal to the number of segments in the bank.

Figure 3:
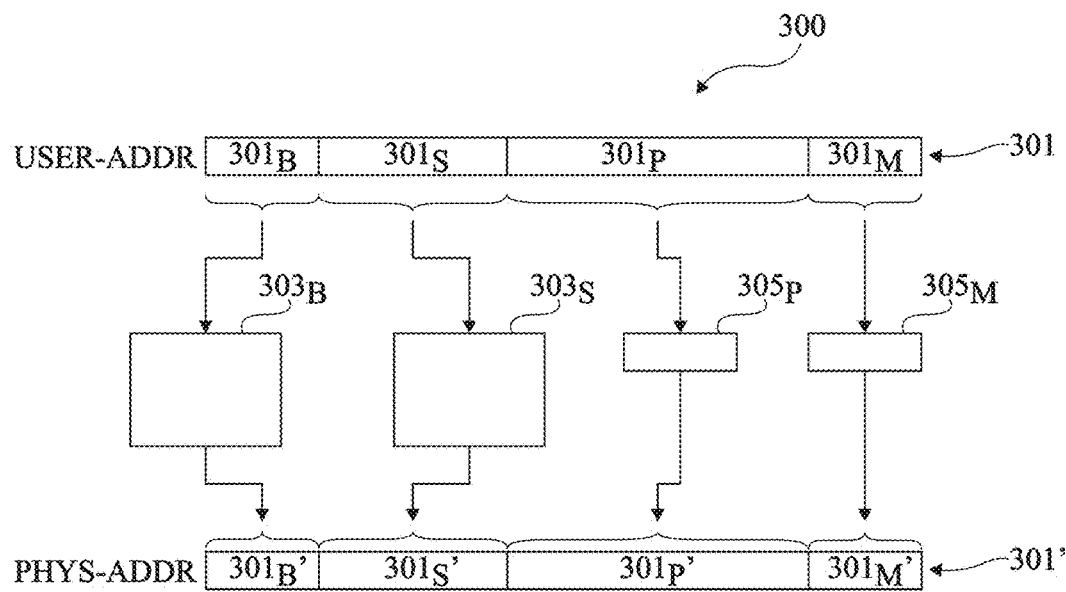
FIG. 3 schematically shows an embodiment of a memory addressing device capable of being used in a system implementing wear management methods of the type described in relation with FIGS. 2A to 2F.

FIG. 3 schematically shows an embodiment of a device 300 enabling, when a wear management method of the type described in relation with FIGS. 2A to 2F is implemented in memory 100 of FIG. 1, to convert logic addresses or user addresses, which are the addresses used by the user to access data in the memory, into so-called physical addresses, which are the addresses where the gate are effectively physically stored in the memory. Device 300 especially enables, when a user accesses the memory via said device, to make data displacements internal to the memory, which result from the wear balancing method, transparent for the user.

In the example of FIG. 3, the case where the wear balancing method implements the mechanisms of FIGS. 2A, 2B, 2C, and 2E is considered as a non-limiting illustrative example.

Device 300 is capable of receiving a user address 301 (USER-ADDR) pointing to a word of memory 100 targeted by the user, and of providing a physical address 301' (PHYS-ADDR), corresponding to the real address at which the content of the targeted word is effectively stored.

User address 301 comprises a first subset of bits 301B defining the address of the bank where, for the user, the targeted content is supposed to be, that is, the address of the bank where the targeted content would effectively be if the wear balancing method was not implemented. User address 301 further comprises a second subset of bits 301S defining, within a bank, the address of the segment where, for the user, the targeted content is supposed to be, a third subset of bits 301P defining, within a segment, the address of the page where, for the user, the targeted content is supposed to be, and a fourth subset of bits 301M defining, within a page, the address of the word where, for the user, the targeted content is supposed to be.

Physical address 301' comprises a first subset of bits 301B' defining the address of the bank where the content of the word targeted by the user is effectively located. Physical address 301' further comprises a second subset of bits 301S' defining, within the bank, the address of the segment where the desired content is effectively located, a third subset of bits 301P' defining, within the segment, the address of the page where the desired content is effectively located, and a fourth subset of bits 301M' defining, within the page, the address of the word where the desired content is effectively located.

Device 300 comprises a first conversion element 303B, capable of converting the user address of bank 301B into the physical address of bank 301B'. In this example, conversion element 303B comprises a bank address translation table comprising b entries of log 2(b) bits each, b being the number of memory banks. For each swapping of banks in the implementation of the wear balancing method of FIG. 2E, the new physical addresses 301B' of the swapped contents are updated in the table.

Device 300 further comprises a second conversion element 303S, capable of converting the user segment address 301S into the physical segment address 301S'. In this example, conversion element 303S comprises, for each bank in the memory, a segment address translation table comprising s entries of log 2(s) bits each, s being the number of segments in the bank. For each swapping of segments in the implementation of the wear balancing method of FIG. 2C, the new physical addresses 301S' of the swapped contents are updated in the corresponding table.

Device 300 further comprises a third conversion element 305P, capable of converting the user page address 301P into the physical page address 301P'. In this example, conversion element 305P comprises, for each segment in the memory, a shift tracking register, containing the number of internal circular rotations undergone by the segment in the implementation of the wear balancing method of FIG. 2B. To determine physical address 301P' of the searched page, device 300 may add to the user page address 301P the value contained in the segment shift tracking register, modulo p, where p is the number of pages in the segment.

Device 300 further comprises a fourth conversion element 305M, capable of converting the user word address 301M into the physical address of word 301M'. In this example, conversion element 305P comprises, for each memory page, a shift tracking register, containing the number of internal circular rotations undergone by the page in the implementation of the wear balancing method of FIG. 2A. To determine physical address 301M' of the searched word, device 300 may add to the user word address 301M the value contained in the page shift tracking register, modulo m, where m is the number of words in the page.

The embodiments described in the present application are not limited to the specific example of address conversion device of FIG. 3. More generally, whatever the displacements of contents implemented in a memory to balance the wear thereof, an address conversion device enabling to convert user addresses into physical addresses may be provided, for example, by using address translation tables and/or shift tracking registers.

It would be desirable to be able to implement a wear management or balancing method implying displacements of contents within the memory, for example, methods of the type described in relation with FIGS. 2A to 2F, without for this to cause a service interruption for the memory user, that is, without for the access to the memory to be blocked for the user during data displacement phases of the wear management method.

Indeed, as an illustrative example, the swapping of the content of two segments of memory 100 of FIG. 1 requires 2*p read operations and 2*p write operations, where p is the number of pages in a segment. Considering the above-mentioned numerical example of a memory comprising 4,096 pages per segment and considering a memory having a page read access time of 50 ns and a page write access time of 50 ns, the time required to swap the content of two segments may be in the order of 2*2*4096*50 ns=819 µs. In many applications, blocking the access to the memory with no interruption for such a time period raises an issue.

According to an aspect of the described embodiments, a system comprising a memory comprising a plurality of portions of a plurality of pages each, this memory comprising two ports enabling to simultaneously access, in read mode, in write mode, or in read and write mode, two pages of different portion of the memory, is provided. This system comprises a control circuit capable of implementing, via a single one of the two memory access ports, a method of managing the wear of the memory, comprising content swappings within a same portion or between different portions of the memory, for example, a method of the type described in relation with FIGS. 2A to 2F. The control circuit is configured to enable at any time the user to access the content of the memory via the other memory access port, including during content swapping phases of the wear management method.

Figure 4:
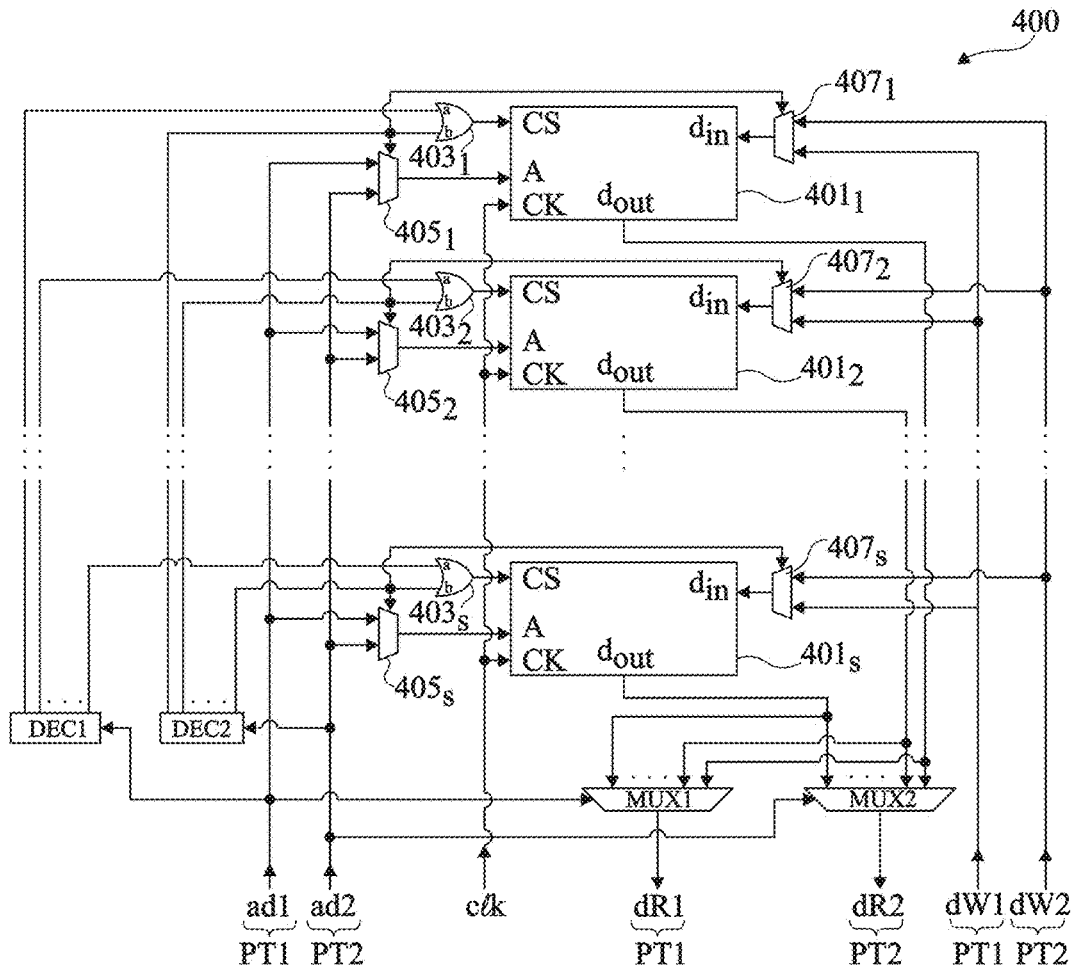
FIG. 4 schematically and partially shows an embodiment of a memory allowing simultaneous accesses to data contained in different portions of the memory.

FIG. 4 schematically and partially shows an embodiment of a memory 400 comprising a plurality of memory portions 401j, j being an integer from 1 to s and s being an integer greater than 1, of a plurality of pages each. Memory 400 comprises two access ports PT1 and PT2 enabling to successively access any two pages of memory 400, provided for these pages to belong to different memory portions 401_j_.

Access port here means an assembly of input and/or output terminals capable of receiving an address signal, of receiving an input data signal, and/or of supplying an output data signal. An access port may in particular comprise an address input over a plurality of bits, capable of receiving a memory page address signal, a data input over a plurality of bits, capable of receiving a data signal to be written into a page of the memory, and a data output over a plurality of bits, capable of delivering a signal of data read from a memory page. The data input and the data output may be confounded. In the example of FIG. 4, access port PT1 of memory 400 comprises an address input ad1, a data input dW1, and a data output dR1, and access port PT2 comprises an address input ad2, a data input dW2, and a data output dR2.

Each portion 401_j_ of memory 400 is formed by a circuit comprising a plurality of elementary storage cells (not shown), for example, resistive memory cells, distributed in a plurality of pages of a plurality of pages each. In this example, each memory portion 401_j_ comprises an input CS capable of receiving a signal of activation/deactivation of portion 401_j_, an input CK capable of receiving a clock signal, an input A capable of receiving an address of a page of memory portion 401_j_, an input din capable of receiving data to be written into address page A of memory portion 401_j_, and an output dout capable of providing data read from address page A of memory portion 401_j_.

In this example, each portion 401_j_ of memory 400 has its activation input CS connected to the output of an OR gate 403_j_ with two inputs a and b. Memory 400 comprises a first address decoding circuit DEC1, comprising an input connected to address input ad1 of access port PT1 of the memory and s binary outputs respectively connected to inputs a of OR gates 403_1_ to 403_s_. Memory 400 further comprises an address decoding circuit DEC2, comprising an input connected to address input ad2 of access port PT2 of the memory and s binary outputs respectively connected to inputs b of OR gates 403_1_ to 403_s_. Decoder DEC1 is capable of determining in which portion 401_j_ of memory 400 the page addressed by input address ad1 is located, and of applying an activation signal on input a of OR gate 403_j_ connected to this memory portion. Decoder DEC2 is capable of determining in which portion 401_j_ of memory 400 the page addressed by input address ad2 is located, and of applying an activation signal on input b of OR gate 403_j_ connected to this memory portion. Thus, decoders DEC1 and DEC2 may simultaneously activate two different memory portions 401_j_. In practice, among the address bits applied to inputs ad1 and ad2, it is possible to only transmit to decoders DEC1 and DEC2 the bits indicating the numbers of the memory portions where the addressed pages are located.

In this example, each portion 401_j_ of memory 400 has its addressing input A connected to the output of a multiplexer 405_j_ of two inputs to one output, and its data input din connected to the output of a multiplexer 407_j_ of two inputs to one output. Each multiplexer 405_j_ has a first input connected to address input ad1 of port PT1 and a second input connected to address input ad2 of port PT2, and each multiplexer 407_j_ has a first input connected to data input dW1 of port PT1 and a second input connected to data input dW2 of port PT2. In this example, each multiplexer 405_j_ further has a selection input connected to input b of OR gate 403_j_ connected to memory portion 401_j_, and each multiplexer 407_j_ has a selection input connected to input b of OR gate 403_j_. The operation of multiplexers 405_j_ and 407_j_ is such that: when a memory portion 401_j_ is activated by decoder DEC1, the address provided by multiplexer 405_j_ on input A of memory portion 401_j_ is that transmitted by address input ad1, and the data provided by multiplexer 407_j_ on input din of memory portion 401_j_ is that transmitted by data input dW1; and when a memory portion 401_j_ is activated by decoder DEC2, the address provided by multiplexer 405_j_ on input A of memory portion 401_j_ is that transmitted by address input ad2, and the data provided by multiplexer 407_j_ on input din of memory portion 401_j_ is that transmitted by data input dW2. In practice, among the address bits transmitted by address inputs ad1 and ad2, it is possible to transmit to multiplexers 405_j_ only the bits defining the position of the addressed page inside of memory portion 401_j_ where it is located.

In this example, memory 400 further comprises a first multiplexer MUX1 of s inputs to one output, having its output connected to data output dR1 of port PT1, and a second multiplexer MUX2 of s to one output, having its output connected to data output dR2 of port PT2. The s inputs of multiplexer MUX1 are respectively connected to the s data outputs dout of the s portions 401_j_ of memory 400. Similarly, the s inputs of multiplexer MUX2 are respectively connected to the s data outputs dout of the s portions 401_j_ of memory 400. In this example, multiplexer MUX1 has a control or selection input connected of address input ad1 of access port PT1 of the memory, and multiplexer MUX2 has a control or selection input connected to address input ad2 of access port PT2 of the memory. The operation of multiplexers MUX1 and MUX2 is such that: when a memory portion 401_j_ is activated by decoder DEC1, the data provided by multiplexer MUX1 on data output dR1 are those provided by memory portion 401_j_ on its output dout; and when a memory portion 401_j_ is activated by decoder DEC2, the data provided by multiplexer MUX2 on data output dR2 are those provided by memory portion 401_j_ on its output dout. In practice, among the address bits applied to inputs ad1 and ad2, it is possible to only transmit to multiplexers MUX1 and MUX2 the bits indicating the numbers of the memory portions where the addressed pages are located.

In this example, inputs CK of the different portions 401_j_ of memory 400 are connected to a same node clk of application of a clock signal.

As an example, the different portions 401_j_ of memory 400, and elements 403_j_, 405_j_, 407_j_, DEC1, DEC2, MUX1, and MUX2 may be integrated in a same semiconductor chip.

An advantage of memory 400 is that it allows simultaneous accesses in read mode, in write mode, or in read and in write mode, to different memory pages, while having a bulk scarcely larger than that of a singleport memory.

Figure 5:
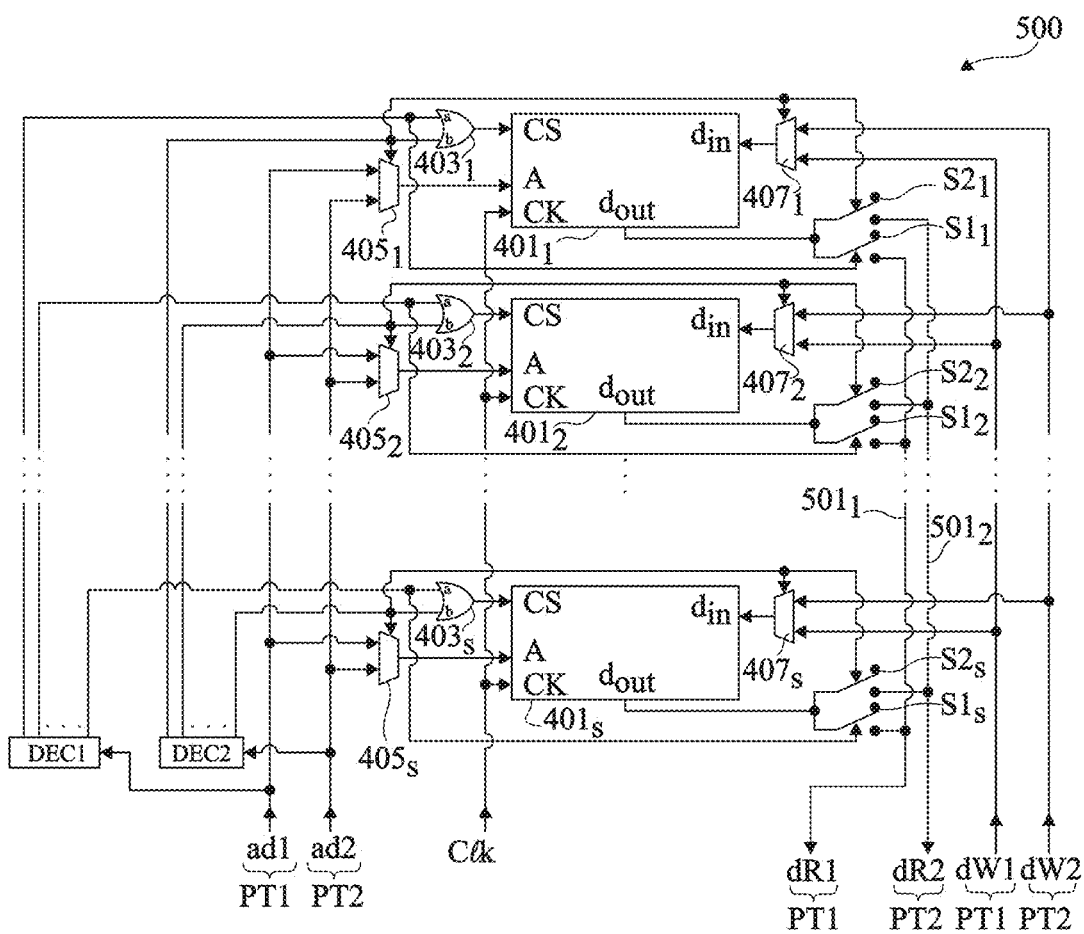
FIG. 5 schematically and partially shows another embodiment of a memory allowing simultaneous accesses to data contained in different portions of the memory.

FIG. 5 schematically and partially shows a memory 500 corresponding to an alternative embodiment of memory 400 of FIG. 4. Memory 500 of FIG. 5 comprises many elements in common with memory 400 of FIG. 4. These elements will not be described again herein. In the following, only the differences between memories 400 and 500 will be highlighted.

Memory 500 comprises, as in the example of FIG. 4, a first access port PT1 comprising an address input ad1, a data input dW1, and a data output dR1, and a second access port PT2 comprising an address input ad2, a data input dW2, and a data output dR2.

Further, memory 500 comprises a plurality of memory portions 401_j_, _j_ being an integer in the range from 1 to s and s being an integer greater than 1, identical or similar to those of memory 400 of FIG. 4.

In memory 500, the mechanisms of selection of portions 401j, via decoders DEC1 and DEC2 and OR gates 403j, the page addressing mechanisms in portions 401j, via multiplexers 405j, and the mechanisms for supplying portions 401j with input data, via multiplexers 407j, are identical or similar to those of memory 400 of FIG. 4, and will not be described again.

Memory 500 of FIG. 5 differs from memory 400 of FIG. 4 mainly by the circuits used to multiplex the data outputs dout of the different memory portions 401j, towards data outputs dR1 and dR2 of ports PT1 and PT2, respectively. In memory 500, each memory portion 401j has its output dout connected, by a first switch S1j, to an output data bus 5011 connected to data output dR1 of the memory and, by a second switch S2j, to an output data bus 5012 connected to data output dR1 of the memory. In this example, each switch S1j has a control node connected to input a of OR gate 403j connected to memory portion 401j, and each switch S2j has a control node connected to input b of OR gate 403j. When a memory portion 401j is activated by decoder DEC1, data output dout of memory portion 401j is connected to data output dR1 of the memory by turning-on of switch S1j, and when a memory portion 401j is activated by decoder DEC2, data output dout of memory portion 401j is connected to data output dR2 of the memory by turning-on of switch S2j.

Thus, in memory 500, multiplexers MUX1 and MUX2 of FIG. 4 are replaced with a distributed multiplexing circuit, distributed at the level of the different memory portions 401j. Switches S1j and S2j are for example formed by MOS transistors. Each pair of switches S1j, S2j is for example arranged in the vicinity of the corresponding memory portion 401j. Further, output data buses 5011 and 5012 preferably run close to the different memory portions 401j.

An advantage of the alternative embodiment of FIG. 5 is that it enables, as compared with the example of FIG. 4, to decrease the number of cables or tracks connecting outputs dout of the different memory portions 401j to data outputs dR1 and dR2 of the memory (and thus to decrease the memory surface area and cost).

Figure 6:
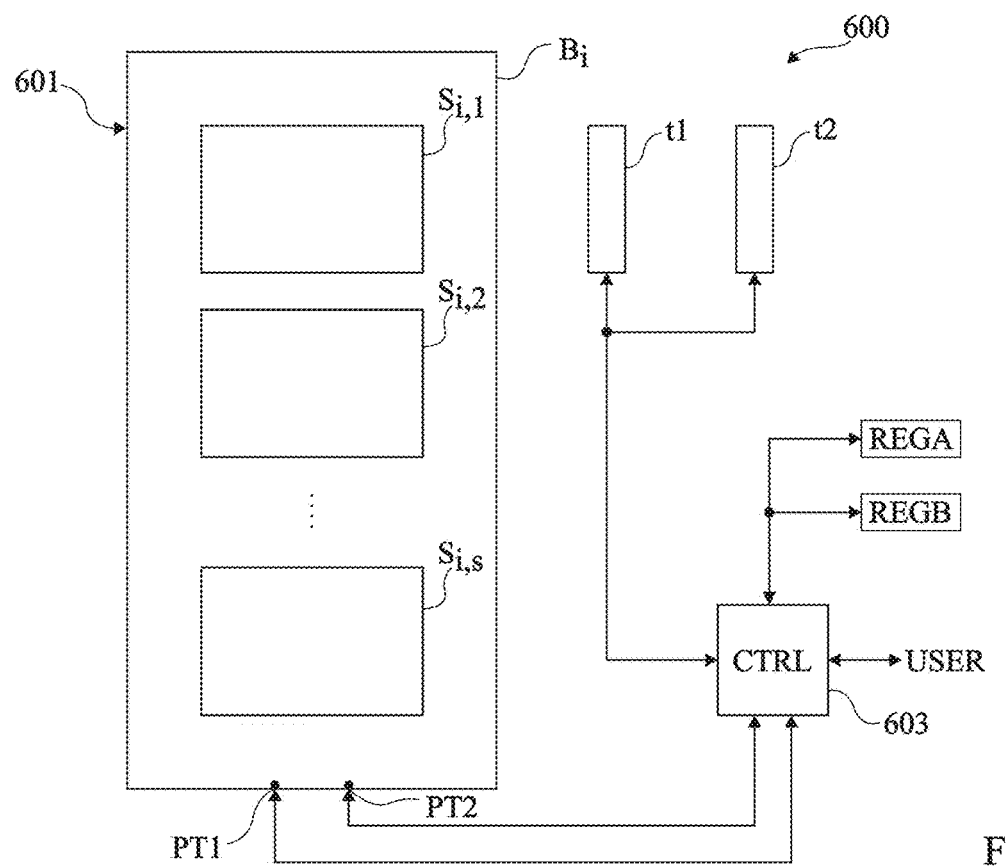
FIG. 6 schematically and partially shows an embodiment of a system comprising a memory and of means for implementing a method of managing the wear of this memory.

FIG. 6 schematically and partially shows an embodiment of a system 600 comprising a memory 601 and means for implementing a method of managing the wear of this memory.

Memory 601 for example has a logic organization identical or similar to that of memory 100 of FIG. 1. FIG. 6 shows a single bank Bi of memory 601. Memory 601 comprises at least two ports enabling to simultaneously access different memory portions. As an example, each bank Bi of memory 601 comprises two access ports PT1 and PT2 enabling to directly access two pages of different segments Si,j in the bank. Each bank Bi of memory 601 for example has an architecture of the type described in relation with FIGS. 4 and 5, where each memory portion 401j (FIGS. 4 and 5) corresponds to a segment Si,j of the bank.

System 600 comprises a control circuit 603 (CTRL), for example comprising a specific cabled circuit or a microcontroller. Circuit 603 is capable of receiving memory access requests from the user (USER), and of processing such requests in priority, by accessing banks Bi of the memory via access ports PT1 of these banks. Circuit 603 is further capable of implementing, in parallel with the user accesses, a method of managing or balancing the wear of memory 601, comprising data displacements within a same segment or between different segments of a same bank or different banks, for example, a method of the type described in relation with FIGS. 2A to 2F. To perform the data displacements of the wear balancing method, circuit 603 accesses the memory via access ports PT2 of banks Bi. When a data displacement of the wear balancing method is being performed by control circuit 603, within a segment of between different memory segments, circuit 603 may access the data to be displaced for each cycle during which the segment(s) containing the data are not used, either because no memory access is being performed by the user, or because the user is using other memory segments. So that the data displacements implemented by the wear balancing method can be, from the addressing viewpoint, transparent for the user, system 600 may comprise an address conversion device (not shown in FIG. 6) of the type described in relation with FIG. 3. The address conversion device may be updated by 603 as the data displacements are performed.

In the example of FIG. 6, system 600 comprises two tables t1 and t2, each comprising a number of 2-bit entries or values equal to the number of pages Pi,j,k contained by a segment Si,j, that is, p 2-bit entries in this example. Further, system 600 comprises two registers REGA and REGB capable of each storing the content of a memory page Pi,j,k. Control circuit 603 is capable of reading from and writing into tables t1 and t2 and registers REGA and REGB. As a non-limiting example, tables t1 and t2 and registers REGA and REGB may be formed in a memory of different technology than that of memory 601, for example, in a memory having shorter access times than memory 601, for example, a SRAM (Static Random Access Memory).

When a page content displacement within a segment is performed by circuit 603, circuit 603 may assign table t1 to the concerned segment Si,j, and update table t1. For each page of segment Si,j, table t1 indicates the state of the page among the following possibilities:

the page content has not been transferred; or the page content is in register REGA (in the process of being transferred); or the page content is in register REGB (in the process of being transferred); or the page content has been transferred into another page.

As an example, to perform an internal circular rotation of a segment Si,j of bank Bi on implementation of the method of FIG. 2B, circuit 603 may for example, for each cycle during which segment Si,j is not being used by the user, either because no memory access is being performed by the user in bank Bi, or because the user is using another segment of bank Bi, implement one of the steps of the following method:

reading the content of the first page Pi,j,1 of segment Si,j, writing this content into register REGA, and updating table t1 for this page;

reading the content of the second page Pi,j,2 of segment Si,j, writing this content into register REGB, and updating table t1 for this page;

writing the content of register REGA into the second page Pi,j,2 of the segment and updating table t1 for page Pi,j,1;

reading the content of the third page Pi,j,3 of segment Si,j, writing this content into REGA, and updating table t1 for this page;

writing the content of register REGB into the third page Pi,j,3 of the segment and updating table t1 for page Pi,j,2;

and so on until the transfer of the content of the last page Pi,j,p of the segment into the first page Pi,j,1.

More generally, methods of the same type may be implemented by circuit 603 to displace data either within a same segment Si,j or between different memory segments, whatever the envisaged displacements (circular rotation of the words in the page—FIG. 2A, swapping of segments within a bank—FIG. 2C, circular rotation of segments within a bank—FIG. 2D, bank swapping—FIG. 2E, circular rotation of the memory banks—FIG. 2F, or others). When a displacement of page contents between first and second different segments is performed, circuit 603 may assign table t1 to the first segment and assign table t2 to the second segment, and keep tables t1 and t2 updated. Tables t1 and t2 indicate the state (transferred, non-transferred, or in the process of being transferred) of each of the pages of each of the two concerned segments. Displacements comprising a plurality of swappings of segment contents within a same bank may be performed sequentially.

If a user access occurs in a segment Si,j while an ongoing data displacement affects this segment, circuit 603 may consult table t1 or t2 assigned to the segment to know:

whether the content of the targeted page has already been transferred, in which case the data are read from or written at their new address in the memory;

whether the content of the targeted page is in register REGA or in register REGB, in which case the data are read from or written into register REGA or REGB; or whether the content of the targeted page has not been transferred, in which case the data are read from or written at their original address in segment Si,j.

System 600 of FIG. 6 enables to implement a wear management or balancing method implying displacements of contents within the memory, such content displacements being transparent for the memory user, in terms of addressing of the data by the user as well as in terms of the times of access to the data by the user.

In a non-limiting embodiment, circuit 603 may be rated by a clock having a higher frequency than memory 601, and user accesses to the memory may be performed at any clock cycle of circuit 603. In this case, it may be desirable to perform no read or write operation in a memory segment Si,j in the case of the wear balancing method, when bank Bi containing this segment is not being read from or written into by the user. Indeed, a read or write operation started in segment Si,j in the context of the wear balancing method might prevent from immediately responding to a request from the user to read from or write into this same segment Si,j. Thus in an alternative embodiment, circuit 603 may be configured to only access a memory segment Si,j in the context of the wear balancing method simultaneously to a user access to another segment Si,j' of the same bank.

Further, in the case where write accesses to the memory are longer than read accesses, it may be desirable not to perform a write operation into a memory segment Si,j in the context of the wear balancing method when another segment Si,j' of the same bank Bi is being simultaneously read from by the user. Indeed, a write operation started in segment Si,j in the context of the wear balancing method might prevent from immediately responding to a user request targeting segment Si,j after the end of the user reading from segment Si,j'. Thus, in an alternative embodiment, circuit 603 may be configured to only access in write mode to a memory segment Si,j in the context of the wear balancing method simultaneously to a write user access to another segment Si,j' of the same bank. In another variation, if memory read accesses are longer than write accesses, circuit 603 may be configured to only access in read mode to a segment Si,j of the memory in the context of the wear balancing method simultaneously to a user read access to another segment Si,j' in the same bank.

It should be noted that the above-mentioned mechanisms only enable to perform the data displacements of the wear balancing method if, during at least a certain proportion of the system operating time, the segment(s) containing the data to be displaced are not read from or written into by the user. However, if an uninterrupted sequence of access to different addresses of a segment Si,j containing data to be displaced is carried out by the user, the wear balancing method will be placed in waiting mode while letting this segment wear prematurely. Such an uninterrupted sequence of access to a segment for a long time period may be due to the intensive use by a user application of a small portion of the memory, or may be the result of a malicious use aiming at intentionally wearing the memory in order to destroy it.

In an alternative embodiment, to avoid such a premature wear of a memory segment Si,j, it may be provided to scramble the user addresses by means of an encryption key, for example, stored in the memory on manufacturing thereof. As an example, the user addresses may be combined with the encryption key by means of an XOR gate, before being used by control circuit 603 to access the memory. An application which only uses a portion of the memory then sees its accesses distributed in different memory segments. Further, it becomes more difficult for a malicious user to find an address sequence enabling to uninterruptedly access different addresses of a same memory segment Si,j. Preferably, in the architecture of FIG. 6, the bank addresses are not scrambled. Indeed, banks Bi of memory 601 being capable of being addressed in parallel, it is preferable for the user to be able to know whether the data to which he/she desires to access are contained in a same bank or in different banks.

The use of an encryption key to scramble the addresses inside of bank Bi however does not enable to protect the memory against a malicious use continuously and uninterruptedly writing or reading the same memory address, to intentionally wear the memory in order to destroy it.

To prevent this risk, circuit 603 or an upstream user circuit (not shown) may be configured to insert an access to another segment or an empty cycle between two consecutive user accesses at a same memory address.

As a variation, system 600 may comprise a cache, that is, a buffer memory forming an interface between memory 601 and the user, this cache being capable of storing the content of one or of a plurality of pages and of their addresses. During a user access to the memory, control circuit 603 sees whether the address targeted by the user is already present in the cache. If it is, control circuit 603 accesses the data in the cache (in read or in write mode) without passing through the memory. If it does not, control circuit 603 accesses the data in the memory (in read or in write mode), and writes into the cache the data read from or written into the memory as well as its address. Thus, successive accesses to a small number of data, not only do not wear out the memory since they occur in the cache, but further leave free cycles for the implementation of the wear balancing method. The larger the size of the cache, the higher the efficiency of the protection. If the cache has a size enabling to store the entire content of a segment, the above-mentioned mechanism of address scrambling by means of an encryption key may be omitted.

Figure 7:
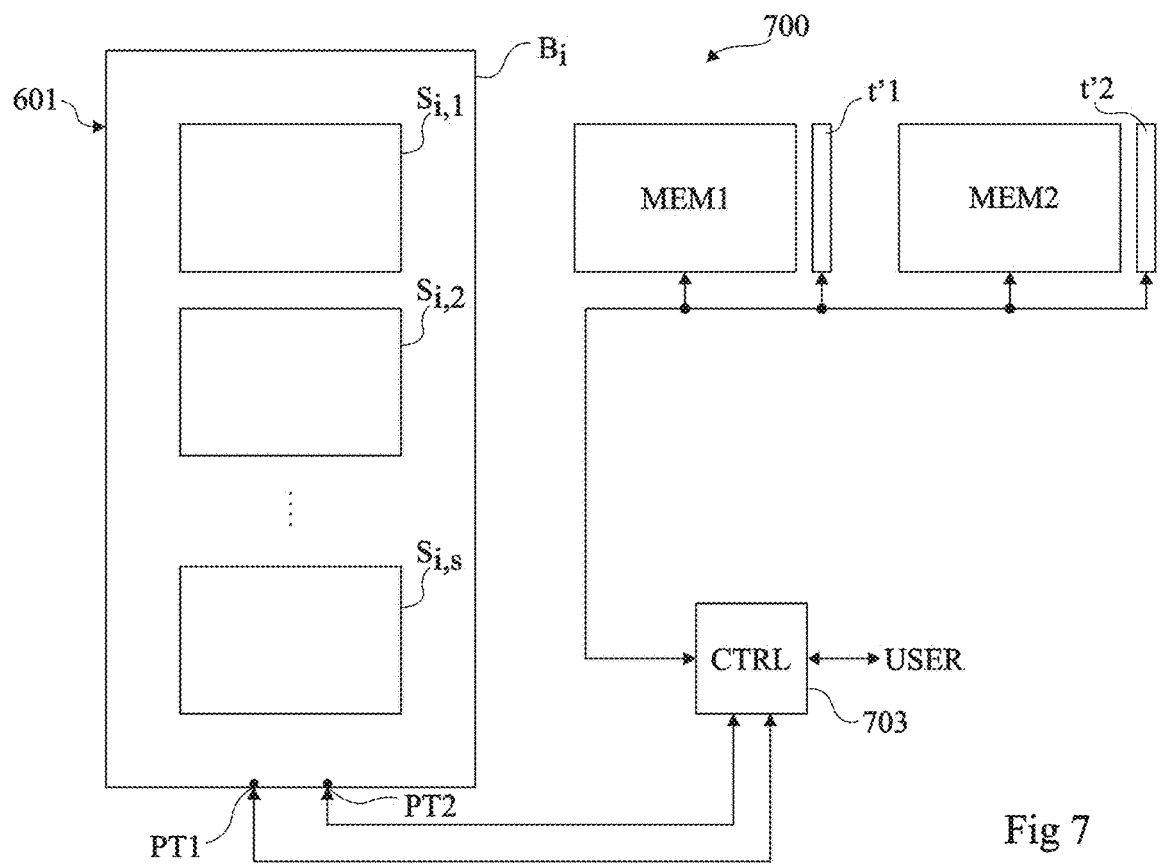
FIG. 7 schematically and partially shows another embodiment of a system comprising a memory and of means for implementing a method of managing the wear of this memory.

FIG. 7 schematically and partially shows an alternative embodiment of system 600 of FIG. 6. System 700 of FIG. 7 comprises elements common with the system of FIG. 6. After, only the differences between systems 600 and 700 will be highlighted.

In this example, system 700 of FIG. 7 comprises the same memory 601 as system 600 of FIG. 6, and comprises means for implementing a method of managing the wear of this memory. System 700 of FIG. 7 differs from system 600 of FIG. 6 mainly by the means used to implement data displacements in memory 601 in the context of the wear management method.

System 700 comprises a control circuit 703 (CTRL), for example comprising a specific cabled circuit or a microcontroller. Circuit 703 is capable of receiving memory access requests from the user (USER), and of processing such requests in priority, by accessing each bank Bi of the memory via access port PT1 of this bank. Circuit 703 is further capable of implementing, in parallel with the user accesses, a method of managing or balancing the wear of memory 601, comprising data displacements within a same segment or between different segments of a memory 601. To perform the data displacements of the wear balancing method, circuit 703, like circuit 603 of FIG. 6, accesses memory 601 via access ports PT2 of banks Bi, only when the segments containing the data to be displaced are not being used by the user.

System 700 does not comprise tables t1 and t2 and registers REGA and REGB of system 600 of FIG. 6. System 700 however comprises two buffer memories MEM1 and MEM2 of a size enabling to each store the content of an entire segment Si,j of memory 601, that is, the content of p pages Pi,j,k in this example. Memories MEM1 and MEM2 may be memories having shorter read and write access times than memory 601. As an example, memories MEM1 and MEM2 are SRAMs. System 700 comprises more than two tables t1' and t2', respectively associated with memories MEM1 and MEM2, each comprising a number of 1-bit entries or values equal to the number of pages Pi,j,k contained by a segment Si,j, that is, p 1-bit entries in this example.

Each time a data displacement internal to a segment Si,j of the memory is performed in the context of the wear management method, all the inputs of table t1' are first set to a first state, for example, to binary value '0'. For each page of segment Si,j, table t1' indicates whether the content of the page has (binary value '1' in this example) or has not (binary value '0' in this example) been transferred into buffer memory MEM1. The content of segment Si,j is then entirely copied, page by page, into memory MEM1 by control circuit 703 in a first copying phase. Along the copying of the content of segment Si,j into memory MEM1, the inputs of table t1' are updated by circuit 703. Before copying the content of a page into memory MEM1, circuit 703 verifies, via table t1', whether this page has or not been copied into memory MEM1. In this example, circuit 703 only copies a page if the corresponding entry in table t1' is at value '0'.

When the entire content of segment Si,j has been copied into memory MEM1, the content of memory MEM1 is copied into segment Si,j, by placing the content of each page of memory MEM1 at its new destination in segment Si,j, during a second copying phase. Each time a page of memory MEM1 is copied into segment Si,j, table t1' is updated for this page.

If a user access occurs in a segment Si,j during a data displacement within this segment, circuit 703 verifies whether the first phase of copying the content of segment Si,j into memory MEM1 is over or not. If the first copying phase is not over, circuit 703 looks up in table t1' whether the content of the targeted page Pi,j,k has already been transferred into memory MEM1 or not. Otherwise, if the user access is a write access, the user data are directly written into memory MEM1, and if the user access is a read access, the data are read from segment Si,j, transmitted to the user, and written into memory MEM1. Table t1' is updated (setting to state '1' in this example) for page Pi,j,k. If the content of the page Pi,j,k targeted by the user has already been transferred into memory MEM1, the user access (in read or in write mode) is directly performed in memory MEM1. If the first copying phase is over and if circuit 703 performs the second phase of copying the content of memory MEM1 into segment Si,j, the read and write user accesses may be performed in memory MEM1. If the user access is a write access, table t1' is updated for the written page, to indicate that this page has not been copied yet in segment Si,j (setting to state '1' in this example). At the end of the phase of copy of the content of memory MEM1 into segment Si,j, one or a plurality of additional copying phases may be carried out to transfer into segment Si,j the content of the pages which would have been written by the user into memory MEM1 after having already been copied once into segment Si,j. The phase of data displacement within the segment ends when all the entries of table t1' are at state '0'.

An uninterrupted sequence of read accesses of the user to the data of segment Si,j does not prevent circuit 703 from performing the data displacement of the wear balancing method, since the pages which have not been transferred yet into memory MEM1 are transferred on the occasion of user accesses, and the pages already transferred are directly read from memory MEM1, in parallel with another page transfer of segment Si,j to memory MEM1.

An uninterrupted sequence of user write operations in a same page Pi,j,k of segment Si,j could prevent the data displacement of the wear balancing method from continuing, but would not wear out segment Si,j, since write user accesses are all performed in memory MEM1.

An uninterrupted sequence of user write operations at different addresses of segment Si,j during the phase of copy of the content of memory MEM1 into segment Si,j could prevent the data displacement of the wear balancing method from carrying on while letting segment Si,j prematurely wear out. However, such an uninterrupted sequence of write accesses (with no read access) for a long time period may only be the result of a malicious use aiming at destroying the memory. This may be avoided by using an address scrambling mechanism of the type described in relation with FIG. 6, using an encryption key, or a cache mechanism.

When a data displacement between two different memory segments Si,j and Si',j' is performed in the context of the wear management method, the two buffer memories MEM1 and MEM2 are used, as well as the two tables t1' and t2'. The swapping of the contents of the two segments comprises a phase of copy of the content of the destination segment into memory MEM1, a second phase of copy of the content of the source segment into memory MEM2, a third phase of copy of the content of memory MEM1 into the source segment, and a fourth phase of copy of the content of memory MEM2 into the destination segment. The different copying phases as well as the user accesses to the contents of the source and destination segments may be managed by control circuit 703 by means of tables t1' and t2', similarly to what has been described hereabove for the case of a displacement internal to a segment.

In the embodiments of FIGS. 6 and 7, if the memories used to form tables t1 and t2 (FIG. 6), registers REGA and REGB (FIG. 6), buffers MEM1 and MEM2 (FIG. 7), tables t1' and t2' (FIG. 7), as well as other data storage elements useful to implement the wear balancing method (memory access counters, tables of translation of user addresses into physical addresses, displacement tracking registers, etc.) are volatile memories, for example, made in SRAM technology, it may be provided, at the system powering-off, to transfer the data contained in the various storage elements into a non-volatile memory.

Specific embodiments have been described. Various alterations, modifications, and improvements will readily occur to those skilled in the art.

In particular, the described embodiments are not limited to the above-mentioned examples of logic organization of the elementary cells in a memory or to the above-mentioned examples of data displacements in the memory to balance the wear thereof.

More generally, whatever the internal logic organization of the memory, and whatever the data displacements envisaged to balance the wear of the memory, it will be within the abilities of those skilled in the art, based on the above-described teachings, to form a system comprising a memory comprising a plurality of portions of a plurality of pages each, the memory comprising first and second ports enabling to simultaneously access two pages of different portions of the memory, this system comprising a control circuit capable of implementing a wear balancing method by using the second port to perform the data displacements of the wear balancing method, while enabling the user to have a priority access to the content of the memory via the first port.

Further, the described embodiments are not limited to the specific examples described in relation with FIGS. 6 and 7 of means enabling to perform the data displacements of the wear balancing method and to manage user accesses in parallel. It should in particular be noted that the wear balancing method comprises circular rotations of data within a page, for example, of the type described in relation with FIG. 2A, the system may comprise one or a plurality of specific circuits capable of performing a circular shift of the content of a page during a read or write cycle in the main memory.

Further, the described embodiments are not limited to the examples of data displacements described in relation with FIGS. 2A to 2F. More generally, the described embodiments are compatible with all types of data displacements performed in a memory to balance the memory wear. As an example, after a number of accesses to a segment $S_{i,j}$ of the memory, it may be provided to circularly shift by a same increment (for example, by a bit, a byte or a word) the content of each of the pages in the segment. As a variation, after a number of accesses to a segment $S_{i,j}$ of the memory, it may be provided to circularly shift by a same increment (for example, by a bit, a byte or a word) the content of the entire segment. In this last variation, the data initially contained in a memory page may be distributed in two consecutive memory pages. A read or write user access may then require physically accessing two different memory pages, which may increase the times of access to the data from the user's viewpoint. To avoid increasing the times of access to the data, it may be provided to divide the memory into two ports of the type described in relation with FIGS. 4, 5, 6, and 7, each portion of the first memory being capable of containing the pages of odd rank of a segment $S_{i,j}$, and each portion of the second memory being capable of containing the pages of even rank of a segment $S_{i,j}$. The user, as well as the wear management system, can then access at the same time two consecutive pages of a same segment $S_{i,j}$, which enables to respond to user requests or to requests of the wear balancing method within a single memory cycle.

Further, the described embodiments are not limited to the above-mentioned examples of resistive material technologies. More generally, the described embodiments are compatible with all technologies of resistive or non-resistive memories subject to wearing.

Further, embodiments where a wear balancing method comprising data displacements within the memory is implemented via a memory port different from the port used for the user accesses have been described hereabove. The described embodiments however also aim at wear management methods comprising no data displacements within the memory, that is, which do not result in modifying the physical location of the data in the memory. As an example, the described embodiments are compatible with a wear management method comprising operations of refreshment of the data contained in pages of the memory. Such a refreshment operation for example comprises a step of reading the data contained in a memory page, followed by a step of rewriting the data read from the same memory address. In this case, it is provided, similarly to what has been described hereabove, that the read and write steps of the refreshment cycles are implemented via the access port dedicated to the wear management, in order to be transparent for the user. More generally, the described embodiments are compatible with all types of wear management methods comprising read and/or write accesses to the data stored in the memory.

Further, embodiments where, to estimate the wear of a memory portion and to accordingly decide whether to implement or not a wear management method targeting this portion, the read and/or write accesses to the memory portion are counted have been described. The described embodiments are however not limited to this specific case. More generally, any other method enabling to measure or to estimate the wear of a resistive memory portion may be used to decide of the planning of the wear management methods. Such wear measurement methods may for example be implemented by control circuits 603 or 703 of FIGS. 6 and 7, or by any other adapted circuit. The different read and/or write steps of the wear measurement methods may be implemented via the access port dedicated to wear management, to be transparent for the user.

Moreover, to further extend its lifetime, the memory may comprise a stock of redundant cells provided on design of the circuit, that is, cells unused at the beginning of the memory life cycle and intended to replace cells having reached a critical wear threshold after a certain time of use. Wear management methods may, when a word or a page reaches a critical wear threshold, replace the worn-out word or page with a "new" word or page from the redundant cell stock.

As an example, the wear of a resistive memory page may be measured by a method of the type described in patent application US2013/0235649, which is herein incorporated by reference. Such a wear measurement method substantially comprises: reading the page for which the wear is desired to be measured and storing the read data in an intermediate storage element; writing in the highly resistive state (binary value '0') all the bits in the page; applying a bias voltage and measuring the sum of the currents flowing through the elementary cells of the page; and then rewriting into the page the data stored in the intermediate storage element. The sum or average value of the currents flowing through elementary cells of the page then forms an indicator of the wear of the page. Indeed, the higher the current, the lower the resistance of the cells in the highly resistive state, and the more the page is considered as worn. Such a measurement may be compared with that of other pages for the planning of a wear management method of the above-described type.

As a variation, the wear measurement method may comprise not only a first current measurement after the cells in the page have been programmed to the highly resistive state (binary value '0'), but also a second current measurement after the cells in the page have been programmed to the lightly resistive state (binary value '1'). In this case, the difference between the two read current values may form an indicator of the wear of the page. An advantage then is that the criterion of appreciation of the wear is representative of the resistivity difference between the highly resistive state and the lightly resistive state of the cells in the page, which is the quantity which effectively enables the cells to store data.

As a variation, a wear measurement method based on the following principles may be provided:

the current content of the page having its wear desired to be measured is used as a basis for the wear measurement, to avoid the step of writing all the bits in the page at a same value (contributing to the wear of the word); and the wear of the different bits in the page is appreciated individually, the page being considered as worn as soon as one of its bits has reached a critical wear threshold (which enables to detect wearing cases where a single bit in the page, or a small number of bits in the page, are used, while such cases could not be detected by prior methods of measuring the average current flowing through the page).

Such a method may for example comprise the successive steps of:

reading for a first time the content of the page having its wear desired to be measured with a standard current of discrimination between binary values '0' and '1' (that is, a threshold equal to the discrimination threshold used, in normal operating, during user read accesses), and recording the read value in an intermediate storage element;

reading for a second time the content of the page with a current threshold of discrimination between binary values '0' and '1' lowered with respect to the standard threshold, and comparing the read value with the value stored in the intermediate storage element by performing a bit-to-bit XOR between the two values; and if at least one of the output bits of the XOR is at binary value '1', deducing therefrom that the corresponding bit in the page is used.

It should be noted that the measured wear level then depends on the shift between the standard threshold of discrimination between binary values '0' and '1', and the lowered discrimination threshold used during the second reading. A number of read operations greater than two may be carried out by using different discrimination thresholds during the different read operations.

As an example, to analyze the wear of a memory segment, one may provide a method comprising a step of initializing, for example, at value 0, a counter of used pages of the segment, and then, for each page of the segment, the steps of:

a) reading for a first time the content of the page with a first threshold of discrimination between binary values '0' and '1' equal to the standard discrimination threshold, and storing the read value in an intermediate storage element;

b) reading for a second time the content of the page with a second threshold of discrimination between binary values '0' and '1' lowered with respect to the first threshold, and then comparing the read value with the value stored in the intermediate storage element by performing an XOR between the two values;

c) if at least one of the bits of the result of the XOR is at binary value '1', deducing therefrom that the page has an advanced wear level;

d) reading for a third time the content of the page with a third threshold of discrimination between binary values '0' and '1' raised with respect to the first threshold, and then comparing the read value with the value stored in the intermediate storage element by performing an XOR between the two values;

e) if at least one of the bits of the result of the XOR is at binary value '1', deducing therefrom that the page has an advanced wear level;

f) if the page is considered to have an advanced wear level after the second or the third reading, and if redundant pages are available in the memory, replacing the page with a redundant page, that is, reassigning to a redundant page the user address corresponding to the worn page;

g) if the page is considered as having an advanced wear level after the second or the third reading, and if no redundant page is available, starting the segment swapping machine to swap the content of the segment with that of a less worn segment, and stopping the segment wear analysis;

h) if the page is not considered as having an advanced wear level, reading for a fourth time the content of the page with a fourth threshold of discrimination between binary values '0' and '1' lowered with respect to the second threshold, and then comparing the read value with the value stored in the intermediate storage element by performing an XOR between the two values;

e) if at least one of the bits of the result of the XOR is at binary value '1', deducing therefrom that the page has an intermediate wear level lower than the above-mentioned advanced wear level;

j) then, reading for a fifth time the content of the page with a fifth threshold of discrimination between binary values '0' and '1' raised with respect to the third threshold, and then comparing the read value with the value stored in the intermediate storage element by performing an XOR between the two values;

k) if at least one of the bits of the result of the XOR is at binary value '1', deducing therefrom that the page has an intermediate wear level lower than the above-mentioned advanced wear level; and l) if the page is considered as having an intermediate wear level after the fourth or the fifth reading, incrementing the counter of worn pages of the segment.

When all the segment pages have been tested in this way, the value of the counter of worn pages of the segment is compared with a value of the number of worn pages previously determined and stored for this segment. If the new value is greater than the old value, the new value is stored and replaces the old value. If the new value of the number of worn pages is greater than a threshold, a mechanism of swapping of the content of the segment with the content of another less worn segment may be started or programmed. Otherwise, a mechanism of swapping of the contents of the pages within the segment may be started or programmed.

If a user reading occurs in the segment which is being analyzed, such a reading can be performed directly from the memory, given that the content of the segment is not affected by the wear analysis method.

However, if a user write operation occurs in a page being analyzed, the writing is performed both into the memory and into the intermediate storage element storing the content of the page. Thus, the intermediate storage elements used to implement the memory wear analysis method may in particular comprise an address register storing the address of the page being analyzed, to be able to compare this address with the address targeted by the user during a user write access.

It should be noted that steps d), e), j), and k) are optional. In other words, it may be done without reading the data with discrimination thresholds raised with respect to the standard threshold. Indeed, generally, the wear of a page essentially translates as a decrease in the cell resistance when the cell is programmed in the highly resistive state. Thus, the reading with a discrimination threshold lowered with respect to the standard threshold may alone be sufficient to detect worn cells.

The different read and/or write steps of the wear measurement method may be implemented via the access port dedicated to wear management, to be transparent for the user.

Further, in the example of FIG. 6, a system comprising tables t1, t2 each comprising p 2-bit words, indicating whether a page of a segment in the process of being transferred has or not been transferred, has been described. As a variation, if the page transfer is performed in the increasing or decreasing order of segment addresses, tables t1, t2 may be omitted and a counter may be incremented for each page transfer. In a user access, the address targeted by the user may be compared with the value of the counter, to know whether the corresponding page has or not been transferred.

Further, the described embodiments are compatible with wear management methods aiming at "repairing" worn cells, or at robustly writing data into worn cells. Such a method may for example comprise alternately writing and deleting defective cells a plurality of times. As a variation or as a complement, a defective cell may be more or less partially regenerated by resetting the cell, that is, by applying thereto a programming voltage of same biasing as the voltage normally used to write into the cell in the lightly-resistive state, but of greater value, and for a time period which may be longer than the normal time taken to write into a cell.

As an example, when a defective word is identified (for example, by a wear measurement method of the above-mentioned type) or when an incorrect writing of a word is detected, a method comprising the following steps may be implemented.

a) Storing the content of the word and, possibly, its address, into an intermediate storage element.

b) Writing (that is, programming to the lightly-resistive state) and then deleting (that is, programming to the highly resistive state) the defective bits (during this step, it may be provided to only process defective bits, to avoid uselessly wearing out the other bits in the word).

c) Measuring the wear of the word, for example, via a wear measurement method of the above-mentioned type, or verifying whether the state of the cells identified as defective has become correct again.

d) If the identified cells are still defective, repeating steps b), c), and d). Otherwise, ending the repair method.

e) When the number of iterations of steps b), c), and d) reaches a threshold and cells are still defective, copying the entire segment containing the word into a redundant segment, and matching the user address for this segment with the physical address of the new segment.

f) Resetting the defective bits of the defective segment by applying thereto a programming voltage of same biasing as the voltage normally used to write into the cell in the lightly-resistive state, but of greater value, for a time period which may be longer than the normal time taken to write into a cell in the lightly-resistive state.

g) When all the defective bits in the segment have been reset, making the segment available in the list of redundant segments, and ending the repair method.

It should be noted that in the case where the defective cells are in the lightly-resistive state, the write and delete operations of step b) may be exchanged.

Such a repair method may for example be implemented by control circuit 603 of FIG. 6 or 703 of FIG. 7, or by any other adapted circuit. The different read and/or write steps of the wear repair method may be implemented via the access port dedicated to wear management, to be transparent for the user.

If a user access targeting a word in the process of being repaired occurs, this access may be performed in the intermediate storage element storing the content of the word or, if the defective word has been swapped with a word of a redundant segment, in the redundant segment which has become the new physical segment for the targeted data.

The invention claimed is:

1. A system comprising:
a first resistive memory comprising a plurality of segments having a plurality of pages each, the first resistive memory comprising first and second memory ports configured to simultaneously access two pages of the first resistive memory that belong to different segments of the plurality of segments, each of said different segments comprising a single port of access to the pages in the respective segment, wherein the single ports can be connected to one or the other of the first and second memory ports of the first resistive memory via multiplexing circuits; and
a control circuit configured to implement, via the second memory port, a wear management method of managing wear of the first resistive memory, the wear management method comprising read and/or write accesses to data stored in the first resistive memory, while simultaneously allowing user accesses to content of the first resistive memory via the first memory port, the control circuit configured to access a particular segment of the first resistive memory for the wear management method only when no user access is being performed on the particular segment of the first resistive memory, wherein the control circuit is configured to only access the particular segment of the first resistive memory for the wear management method simultaneously to user access of another segment of the first resistive memory.

2. The system of claim 1, wherein said wear management method comprises a wear balancing method comprising data displacements resulting in modifying a physical address of the data within the first resistive memory.

3. The system of claim 1, wherein the control circuit is configured to prioritize user accesses to the content of the first resistive memory over accesses of the wear management method.

4. The system of claim 1, comprising a counter or a table configured to provide to the control circuit information regarding which memory addresses are being processed by the wear management method.

5. The system of claim 1, wherein the control circuit is configured to only perform a write access to the particular segment of the first resistive memory for the wear management method simultaneously to a user write access to the another segment of the first resistive memory.

6. The system of claim 1, wherein the control circuit is configured to only perform a read access to the particular segment of the first resistive memory for the wear management method simultaneously to a user read access to the another segment of the first resistive memory.

7. The system of claim 1, further comprising first and second registers capable of each storing the content of a memory page.

8. The system of claim 7, further comprising first and second tables capable of each storing as many 2-bit entries as a memory portion comprises pages.

9. The system of claim 7, wherein, when data are displaced in the first resistive memory by the control circuit in the context of the wear management method, the data transit through the first and/or second registers and, when a user access targeting data contained in the first and/or second registers occurs, the control circuit processes this access in said registers.

10. The system of claim 1, further comprising second and third buffer memories capable of each storing the content of a segment of the first resistive memory.

11. The system of claim 10, further comprising first and second tables capable of each storing as many 1-bit entries as a segment of the first resistive memory comprises pages.

12. The system of claim 10, wherein, when data are displaced in the first resistive memory by the control circuit in the context of the wear management method, the data transit through the second and/or third buffer memories and, when a user access targeting data contained in the second and/or third buffer memories occurs, the control circuit processes this access in said second and third buffer memories.

13. The system of claim 1, further comprising a device capable of converting logic addresses, which are the addresses used by the user to access the content of the first resistive memory, into physical addresses, which are the addresses where the contents targeted by the user in the first resistive memory are effectively stored.

14. The system of claim 13, wherein the address conversion device comprises, for each segment of the first resistive memory, a counter or register for tracking the shifts of pages within the segment.

15. The system of claim 1, comprising a device for scrambling, by means of an encryption key, addresses used by the user to access the content of the first resistive memory.

16. The system of claim 2, wherein the data displacements of the wear balancing method are displacements internal to a single segment of the plurality of segments, or displacements between different segments of the plurality of segments.

17. The system of claim 1, wherein the wear management method comprises a wear measurement method comprising:
 a first reading from a target page, the wear of which is desired to be measured;
 a second reading from said target page with a threshold of discrimination between binary values '0' and '1' modified with respect to the first step; and
 a bit-to-bit comparison of the values read during the first reading and the second reading.

18. The system of claim 1, wherein the first resistive memory comprises a plurality of cells, each cell configured to be programmed in a highly resistive state and in a lightly resistive state, wherein the wear management method comprises a wear restore method comprising alternately writing and deleting, a plurality of times, into and from a memory cell deemed degraded, and/or resetting this cell by applying thereto a voltage of same biasing as a voltage normally used to program this cell to the lightly resistive state, but of greater value.

* * * * *